United States Patent
Zou

(10) Patent No.: US 10,177,503 B2
(45) Date of Patent: Jan. 8, 2019

(54) CONNECTOR ASSEMBLY HAVING AN INSULATOR MOLDED OVER FRONT AND REAR SHIELDING SHELLS

(71) Applicant: LOTES CO., LTD, Keelung (TW)

(72) Inventor: Yun Jun Zou, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/856,469

(22) Filed: Dec. 28, 2017

(65) Prior Publication Data
US 2018/0191104 A1 Jul. 5, 2018

(30) Foreign Application Priority Data

Dec. 30, 2016 (CN) ..................... 2016 2 1469658 U

(51) Int. Cl.
| | | |
|---|---|---|
| H01R 9/03 | (2006.01) | |
| H01R 13/6594 | (2011.01) | |
| H01R 12/70 | (2011.01) | |
| H01R 12/71 | (2011.01) | |
| H01R 13/516 | (2006.01) | |

(Continued)

(52) U.S. Cl.
CPC ....... *H01R 13/6594* (2013.01); *H01R 12/707* (2013.01); *H01R 12/716* (2013.01); *H01R 13/504* (2013.01); *H01R 13/516* (2013.01); *H01R 13/6581* (2013.01); *H01R 13/6658* (2013.01); *H05K 5/0278* (2013.01); *H01R 13/5845* (2013.01); *H01R 24/60* (2013.01)

(58) Field of Classification Search
CPC ...... H01R 12/718; H01R 25/00; H01R 31/06; H01R 33/88; H01R 33/94

USPC ........... 439/607.01, 607.27, 607.45, 607.53, 439/607.57, 607.58
See application file for complete search history.

(56) References Cited

U.S. PATENT DOCUMENTS

| | | | | |
|---|---|---|---|---|
| 5,618,208 A | * | 4/1997 | Crouse | H01R 13/6585 439/607.17 |
| 9,166,342 B1 | * | 10/2015 | Tao | H01R 13/6581 |

(Continued)

FOREIGN PATENT DOCUMENTS

| | | |
|---|---|---|
| CN | 102683971 B | 10/2014 |
| CN | 205212046 U | 5/2016 |
| TW | M520200 U | 4/2016 |

*Primary Examiner* — Chandrika Prasad
(74) *Attorney, Agent, or Firm* — Locke Lord LLP; Tim Tingkang Xia, Esq.

(57) ABSTRACT

A connector assembly includes: an insulating body; multiple terminals disposed in the insulating body; a front shielding shell shielding the insulating body; a rear shielding shell covering a rear end of the front shielding shell, where an accommodating space is formed between the rear shielding shell and an outer surface of the front shielding shell; and an external insulator, molded outside the front shielding shell and the rear shielding shell and filled into the accommodating space. Compared with the related art, the accommodating space limits tension generated when the external insulator is molded, and after molten plastic is cooled, a part of the external insulator will be fastened within the accommodating space, such that the external insulator can be efficiently retained on the front shielding shell and the rear shielding shell, thereby preventing degumming and cracking phenomenons between the front shielding shell and the external insulator.

20 Claims, 10 Drawing Sheets

(51) Int. Cl.
*H01R 13/66* (2006.01)
*H05K 5/02* (2006.01)
*H01R 13/6581* (2011.01)
*H01R 13/504* (2006.01)
*H01R 13/58* (2006.01)
*H01R 24/60* (2011.01)

(56) References Cited

U.S. PATENT DOCUMENTS 10,109,966 B2 * 10/2018 Tsai .................... H01R 13/502
2015/0303622 A1 * 10/2015 Tao .................... H01R 13/6581
　　　　　　　　　　　　　　　　　　　　　439/607.55

* cited by examiner

CONNECTOR ASSEMBLY HAVING AN INSULATOR MOLDED OVER FRONT AND REAR SHIELDING SHELLS

CROSS-REFERENCE TO RELATED PATENT APPLICATION

This application claims priority to and the benefit of, pursuant to 35 U.S.C. § 119(a), patent application Serial No. CN201621469658.8 filed in China on Dec. 30, 2016. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a connector assembly, and in particular to a connector assembly with good combination properties.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A connector assembly includes an insulating body, a plurality of terminals accommodated in the insulating body, a front shielding shell covering outside the insulating body, a rear shielding shell fixed outside a rear end of the front shielding shell, and an external insulator over molding outside the front shielding shell and the rear shielding shell. The front shielding shell has a front shell and a rear shell enlarged relative to the front shell. The front shielding shell is an integral drawing structure. The front shell and the rear shell are connected by an inclined surface such that a step shape is formed between the front shell and the rear shell. A front end of the rear shielding shell bends inward relatively to form a stopping portion, and the stopping portion abuts the inclined surface, such that the rear shielding shell is fastened on the front shielding shell. When the external insulator is injection-molded to the front and rear shielding shells, the external insulator shrinks and generates a tension force after being cooled, and the external insulator is easily degummed and cracked, such that the front and rear shielding shells and the external insulator cannot be reliably combined together. This problem mainly appears at the combination portion of a front end face of the external insulator and the front shielding shell. The external insulator at this location has a relatively weak opening edge which is cracked more easily, a front end of the external insulator is warped outward relatively large, sealing is bad, and warping and deformation make the appearance of the connector assembly unaesthetic. Furthermore, in the case of multiple insertion and extraction, the external insulator may slip relative to the front and rear shielding shells and even fall off.

Therefore, a heretofore unaddressed need to design a novel connector assembly exists in the art to address the aforementioned deficiencies and inadequacies.

SUMMARY

In view of the problem addressed in the background technology, an objective of the present invention is to provide a connector assembly in which an external insulator is tightly combined with a front shielding shell.

To achieve the foregoing objective, the present invention adopts the following technical solution:

A connector assembly includes: an insulating body; a plurality of terminals, disposed in the insulating body; a front shielding shell, shielded outside the insulating body, where the front shielding shell has a front shell and a rear shell enlarged relative to the front shell; a rear shielding shell, covering the rear shell and having a front end portion protruding out of the rear shell and extending forward to the front shell, wherein an accommodating space is formed between the front end portion and an outer surface of the front shielding shell; and an external insulator, molded outside the front shielding shell and the rear shielding shell and filled into the accommodating space.

In certain embodiments, the accommodating space surrounds an outer surface of the front shell.

In certain embodiments, a length of the front end portion protruding forward beyond the rear shell is 0.8 mm or more.

In certain embodiments, the accommodating space extends backward to the rear shell at upper and lower sides of the rear shielding shell, and the accommodating space extends backward to a rear end of the rear shell at left and right sides of the rear shielding shell.

In certain embodiments, the connector assembly further includes an inner insulator, where the rear shell protrudes outward respectively at upper and lower sides thereof and is flushed respectively at left and right sides thereof relative to the front shell, and the inner insulator protrudes outward respectively at left and right sides thereof relative to the rear shell.

In certain embodiments, the connector assembly further includes a cable electrically connected with the terminals, where the rear shielding shell is a straight cylindrical structure, and a rear end of the rear shielding shell is provided with a wire clamping portion for clamping the cable.

In certain embodiments, the front shell and the rear shell are integrated formed, and the front shielding shell and the rear shielding shell are connected through spot welding.

In certain embodiments, the connector assembly further includes a circuit board and an inner insulator covering the circuit board, where the terminals are connected with the circuit board, each of two opposite surfaces of the inner insulator at upper and lower sides thereof is provided with a positioning pinhole recessed inward, and the positioning pinhole is communicated to the circuit board.

In certain embodiments, the connector assembly further includes a circuit board and a cable, where the terminals are connected with the circuit board, one end of the circuit board is formed with a first notch recessed inward, and the cable has two power wires stacked up and down to be disposed at the first notch and electrically connected with the first notch.

In certain embodiments, one end of the circuit board is provided with a second notch recessed inward, and the cable has a metal braiding layer disposed at the second notch and electrically connected with the second notch.

In certain embodiments, the insulating body has a mating slot, the terminals are disposed on upper and lower sides of the mating slot respectively in an upper row and a lower row, and the terminals in the upper and lower rows are 180-degree symmetrical relative to a center of the mating slot.

A connector assembly includes: an insulating body; a plurality of terminals, disposed in the insulating body; a front shielding shell, shielding the insulating body; a rear shielding shell, covering a rear end of the front shielding shell, where an accommodating space is formed between the rear shielding shell and an outer surface of the front shielding shell; and an external insulator, molded outside the front shielding shell and the rear shielding shell and filled in the accommodating space.

In certain embodiments, the accommodating space surrounds an outer surface of the front shell.

In certain embodiments, a length of the accommodating space in a front-rear direction is 0.8 mm or more.

In certain embodiments, the front shielding shell has a front shell and a rear shell enlarged relative to the front shell, the rear shielding shell has a front end portion protruding out of the rear shell, the front end portion extends forward to the front shell, and the accommodating space is formed between the front end portion and the outer surface of the front shielding shell.

In certain embodiments, the connector assembly further includes an inner insulator, where the rear shell protrudes outward respectively at upper and lower sides thereof and is aligned respectively at left and right sides thereof relative to the front shell, and the inner insulator protrudes outward respectively at left and right sides thereof relative to the rear shell.

In certain embodiments, the rear shielding shell is a cylindrical structure, and a front end thereof has a front end portion enlarged outward, the front end portion extends forward to the front shielding shell, and the accommodating space is formed between the front end portion and the outer surface of the front shielding shell.

In certain embodiments, the connector assembly further includes a circuit board and a cable, wherein the terminals are connected with the circuit board, one end of the circuit board forms a first notch recessed inward, and the cable has two power wires stacked up and down to be disposed at the first notch and electrically connected with the first notch.

In certain embodiments, one end of the circuit board is provided with a second notch recessed inward, and the cable has a metal braiding layer disposed at the second notch and electrically connected with the second notch.

In certain embodiments, the insulating body has a mating slot, the terminals are disposed on upper and lower sides of the mating slot respectively in an upper row and a lower row, and the terminals in the upper and lower rows are 180-degree symmetrical relative to a center of the mating slot.

Compared with the related art, according to certain embodiments of the present invention, by forming the accommodating space between the rear shielding shell and the outer surface of the front shielding shell, when the external insulator is injection-molded, the external insulator is molded outside the front shielding shell and the rear shielding shell and is filled into the accommodating space. The accommodating space limits tension generated when the external insulator is molded, and after molten plastic is cooled, a part of the external insulator will be fastened within the accommodating space, such that the external insulator can be efficiently retained on the front shielding shell and the rear shielding shell, thereby preventing degumming and cracking phenomenons between the front shielding shell and the external insulator.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
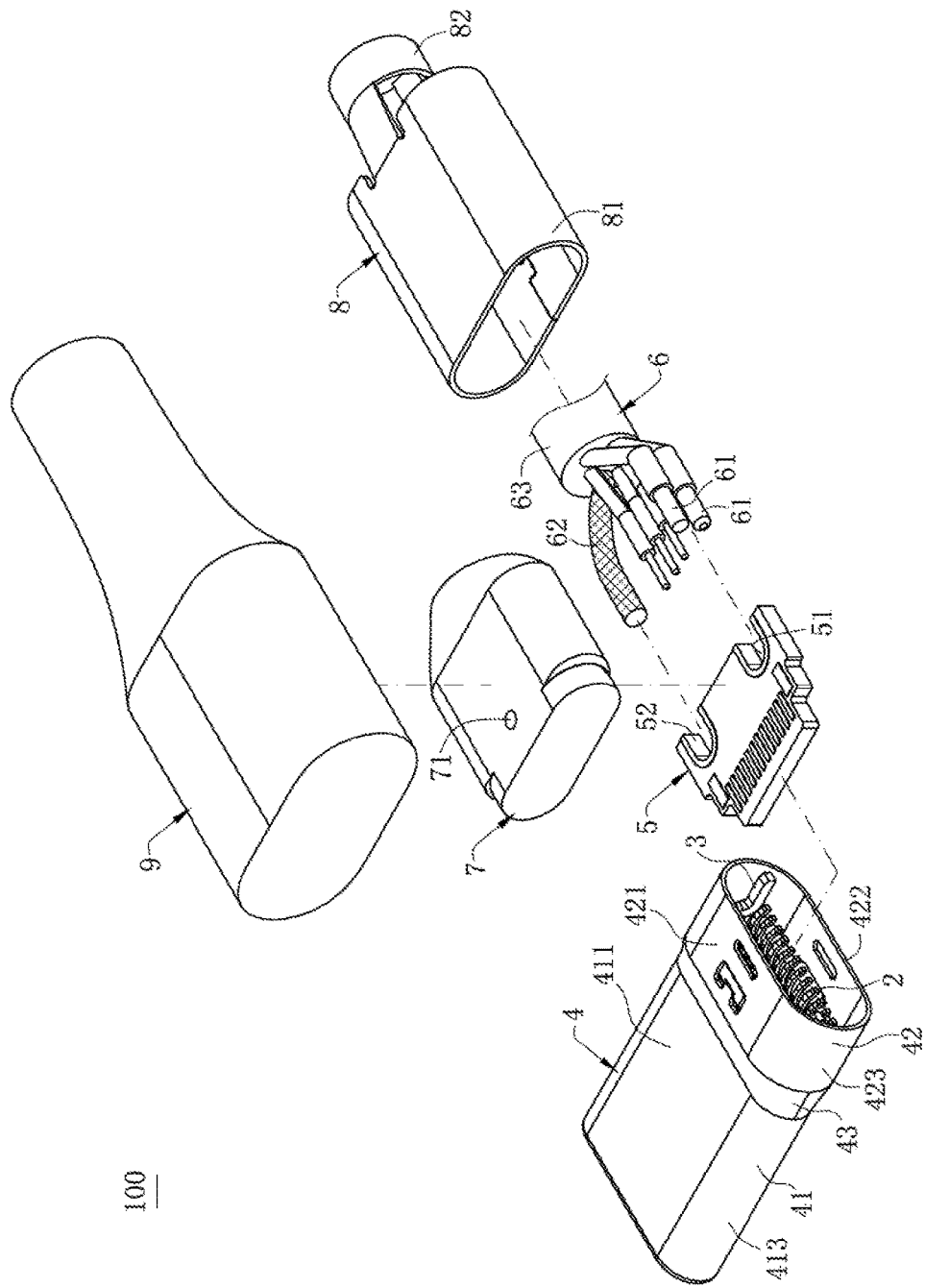
FIG. 1 is a perspective exploded view of a connector assembly according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to a connector assembly.

Figure 6:
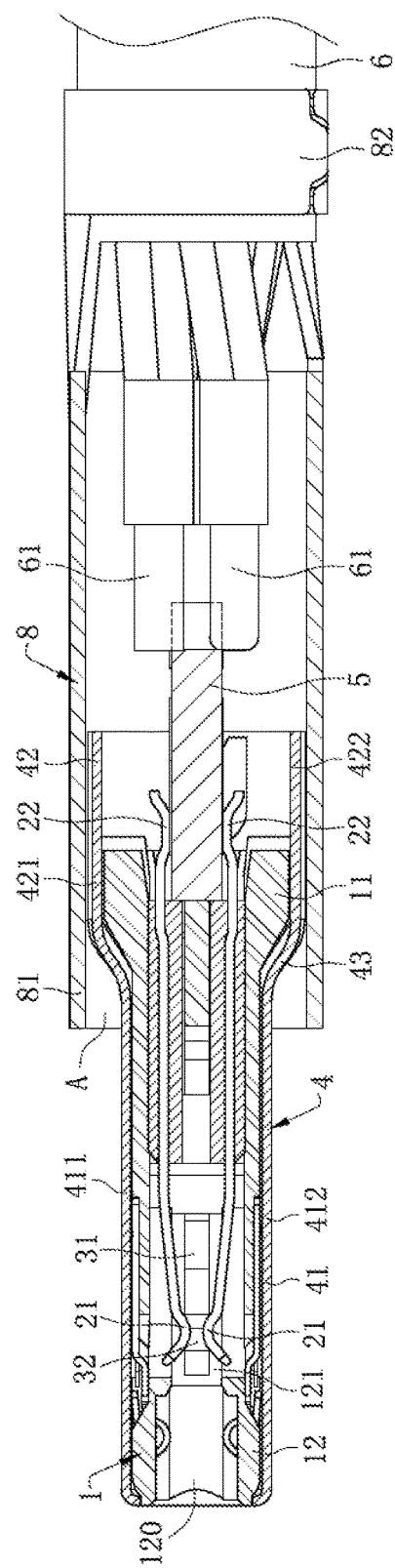
FIG. 6 is a sectional view of inner and external insulators hidden in FIG. 5A.
Figure 7:
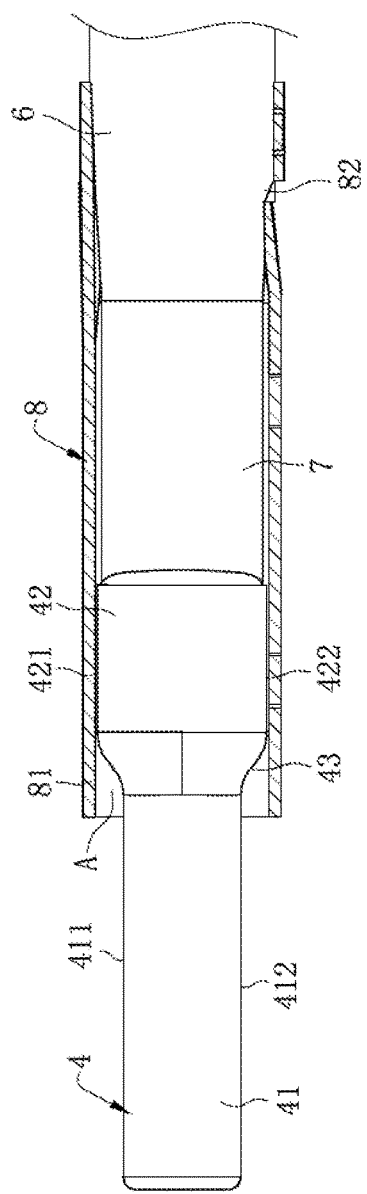
FIG. 7 is a schematic sectional view of only the rear shielding shell in FIG. 5A.

Referring to FIG. 1 and FIG. 6, a connector assembly 100 according to certain embodiments of the present invention includes an insulating body 1, a plurality of terminals 2 disposed in the insulating body 1, a latch member 3 disposed in the insulating body 1, a front shielding shell 4 shielded outside the insulating body 1, a circuit board 5 electrically connected with the plurality of terminals 2, and a cable 6 electrically connected with the circuit board 5. The connector assembly 100 also includes an inner insulator 7 wrapping and molded on a rear end of the terminals 2 and outside the circuit board 5 and the cable 6, and further includes a rear shielding shell 8 covering a rear end of the front shielding shell 4 and outside the inner insulator 7, and an external insulator 9 wrapping and molded outside the front shielding shell 4, the rear shielding shell 8 and the cable 6.

Figure 5A:
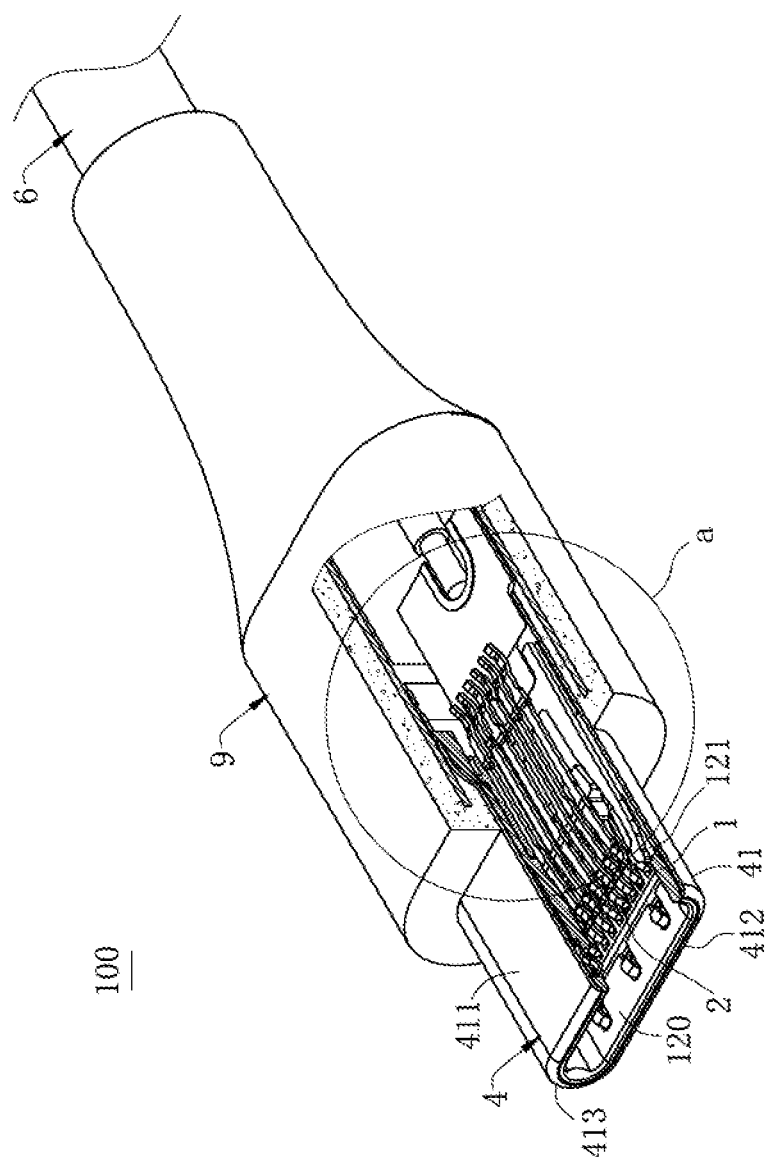
FIG. 5A is a local perspective sectional view of an assembled view of FIG. 1.

Referring to FIG. 5A and FIG. 6, the insulating body 1 includes a base 11 and a mating portion 12 extending forward from the base 11. Dimensions of the base 11 on upper and lower sides are both correspondingly greater than dimensions of the mating portion 12 on the upper and lower sides. That is, the upper and lower sides of the insulating body 1 form a step shape between the base 11 and the mating portion 12, respectively. The mating portion 12 is provided with a mating slot 120 recessed backward from a front end thereof. Both sides of the mating portion 12 are provided with a slot 121 for communicating with the mating slot 120.

Referring to FIG. 5A and FIG. 6, the terminals 2 are disposed on the upper and lower sides of the mating slot 120 respectively in an upper row and a lower row, and each of the terminals 2 has a contact portion 21 protruding forward into the mating slot 120 and a soldering portion 22 extending backward to the outside of the insulating body 1. The soldering portions 22 are correspondingly disposed in upper and lower rows, and the terminals 2 in the upper and lower rows are s180-degree symmetrical relative to a center of the mating slot 120.

Figure 5B:
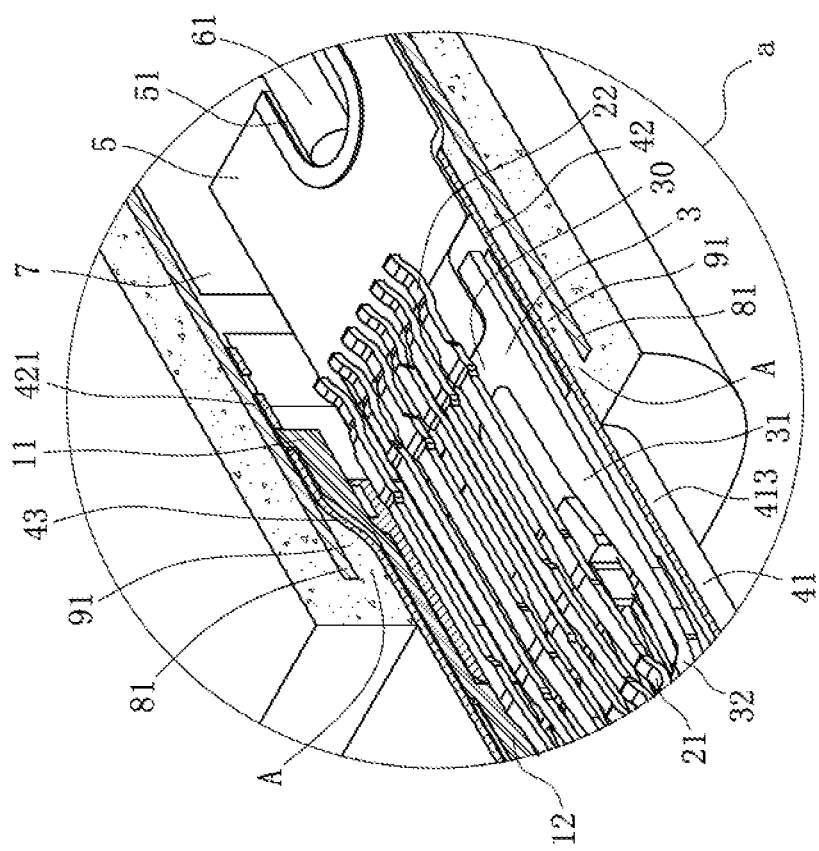
FIG. 5B is an enlarged view of part a in FIG. 5A.

Referring to FIG. 5A, FIG. 5B and FIG. 6, the latch member 3 is molded by blanking a metal plate. The latch member 3 is disposed between the two rows of the terminals 2, and has a connection portion 30 and a pair of latch arms 31 extending forward from two sides of the connection portion 30 respectively. The latch arm 31 is correspondingly located in the slot 121 at the corresponding side, and each latch arm 31 has a latch portion 32 protruding into the mating slot 120.

Figure 9:
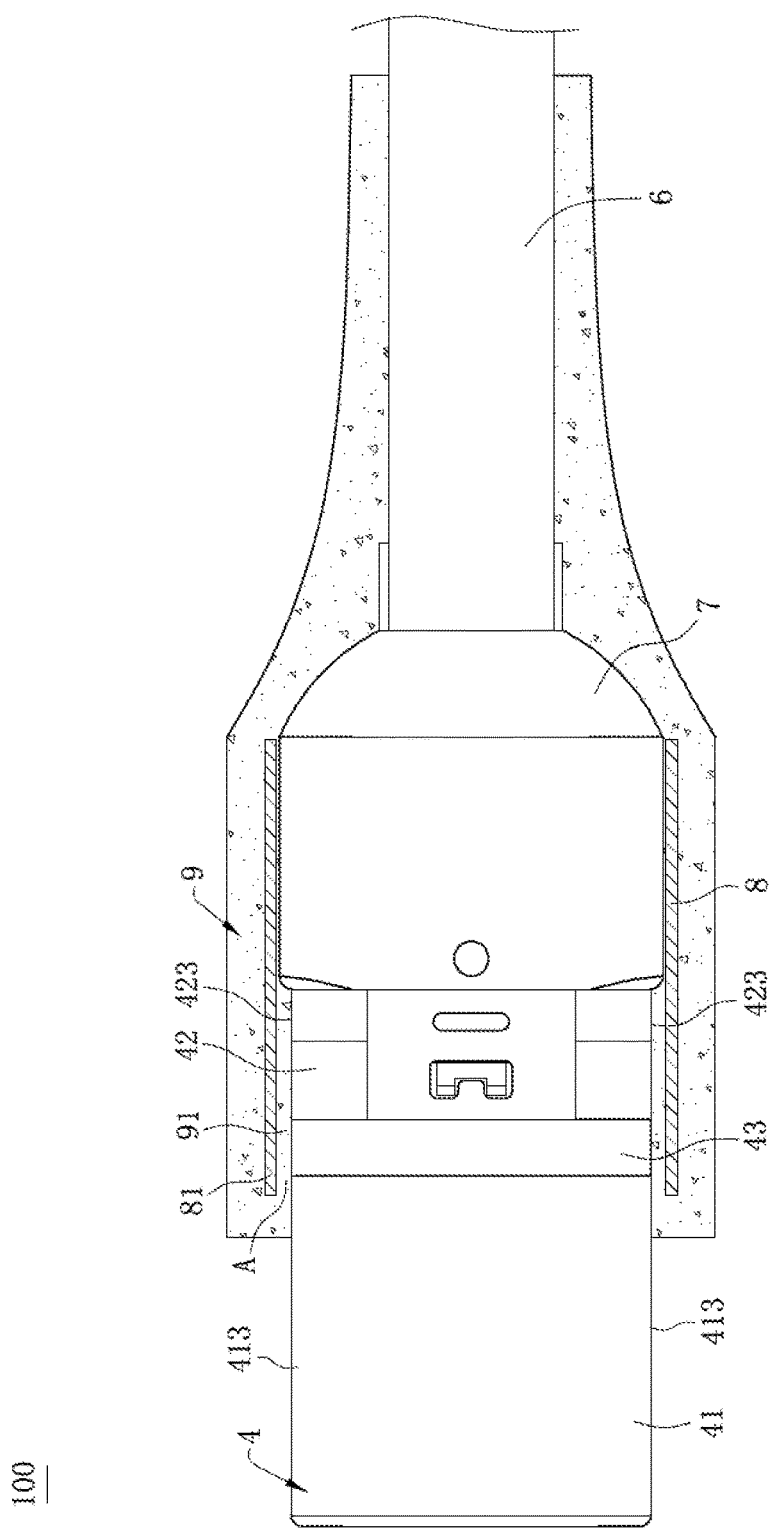
FIG. 9 is another schematic sectional view of only the rear shielding shell and the external insulator in FIG. 5A.

Referring to FIG. 1, FIG. 6 and FIG. 9, the front shielding shell 4 is a cylindrical structure molded by a drawing process, and the shape thereof matches the outer surface of the insulating body 1. The front shielding shell 4 has a front shell 41, a rear shell 42 enlarged relative to the front shell 41, and an inclined portion 43 for connecting the front shell 41 and the rear shell 42. The front shell 41 is located in front of the rear shell 42. The front shell 41 has a front top plate 411 and a front bottom plate 412 disposed on upper and lower sides thereof and opposite to each other, and two front side plates 413 disposed on left and right sides thereof and opposite to each other. The upper and lower sides of the front side plates 413 are connected to the front top plate 411 and the front bottom plate 412. A rear end of the rear shell 42 protrudes backward out of a rear end of the insulating body 1. The rear shell 42 has a rear top plate 421 and a rear bottom plate 422 disposed on upper and lower sides thereof and opposite to each other and two rear side plates 423 disposed on left and right sides thereof and opposite to each other. The upper and lower sides of the rear side plates 423 are connected to the rear top plate 421 and the rear bottom plate 422. The rear top plate 421 is located above the front top plate 411 in a vertical direction, and the rear bottom plate 422 is located below the front bottom plate 412 in the vertical direction. The front side plate 413 is flush with the rear side plate 423 at the corresponding side in a horizontal direction. That is, the front shielding shell 4 is shaped with a small front opening and a large rear opening.

Referring to FIG. 1 and FIG. 6, a front end of the circuit board 5 is clamped between the two rows of the soldering portions 22, and the soldering portions 22 are correspondingly soldered with a plurality of conductive sheets on the circuit board 5 to form the electrical connection. The circuit board 5 has a first notch 51 and a second notch 52 recessed inward from a rear end thereof, and surfaces within the first notch 51 and the second notch 52 are all provided with conductive layers, and upper and lower surfaces of the circuit board 5 corresponding to the periphery of each of the two notches are all provided with conductive layers. The circuit board 5 is further provided with a plurality of conductive pads located between the first notch 51 and the second notch 52.

Figure 2:
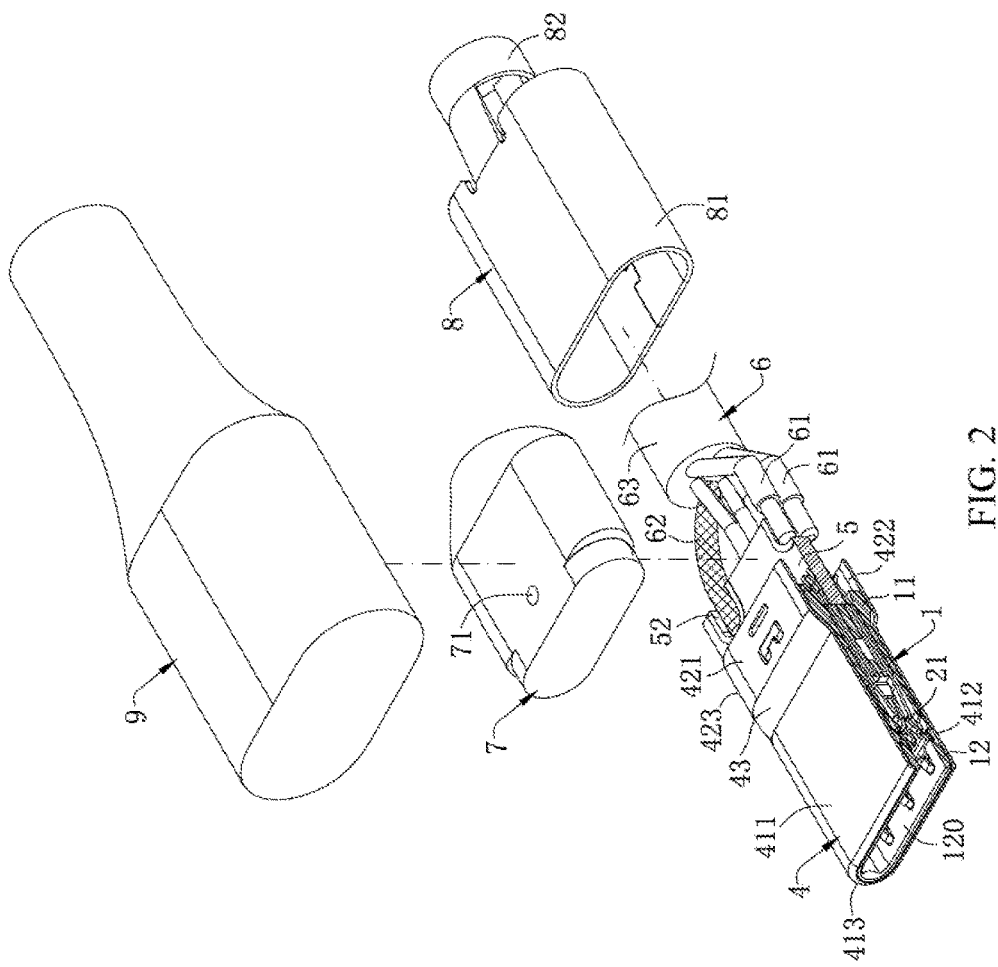
FIG. 2 is a perspective schematic view of a terminal, a cable and a circuit board in FIG. 1 being soldered.
Figure 3:
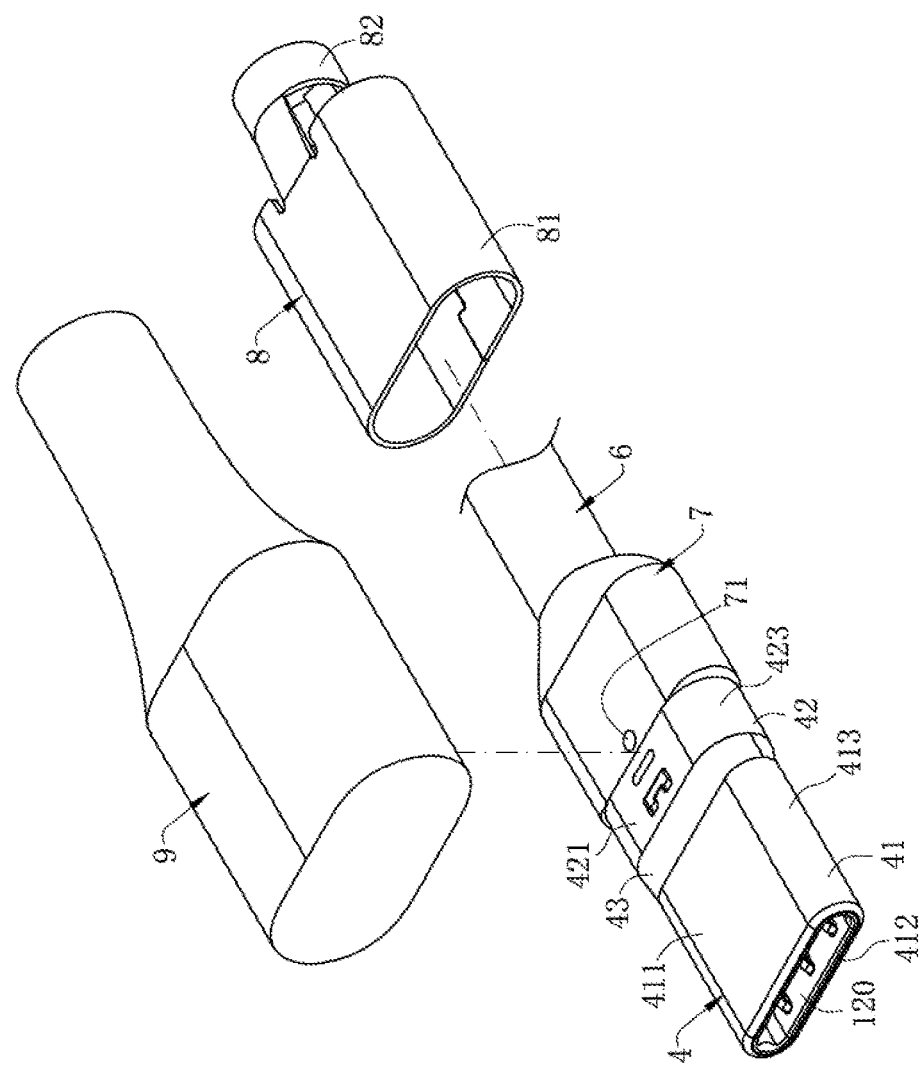
FIG. 3 is a perspective schematic view of an inner insulator being injection-molded outside the terminal, the cable and the circuit board in FIG. 2.
Figure 4:
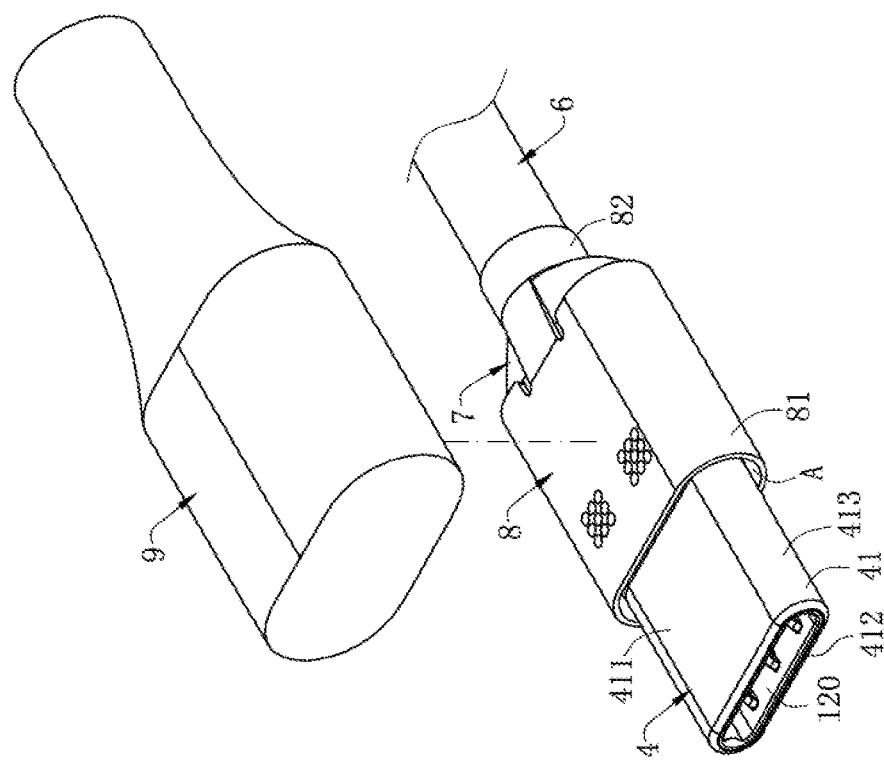
FIG. 4 is a perspective schematic view of a rear shielding shell being sleeved over a front shielding shell and outside the inner insulator in FIG. 3.

Referring to FIG. 1 and FIG. 2, the cable 6 has two power wires 61, a plurality of cores, and an insulating sleeve 63 wrapping outside the two power wires 61 and the cores. Each power wire 61 is used as a positive pole. The two power wires 61 are stacked up and down to be disposed at the first notch 51, and the two power wires 61 are electrically connected with the first notch 51 through a solder. The cores are correspondingly soldered with the conductive pads. A part of the cores has a plurality of metal braiding layers 62, and the metal braiding layers 62 are twisted into one strand. Alternatively, the cable 6 has a metal braiding layer 62 wrapping outside the two power wires 61 and the cores. The metal braiding layer 62 is used as a negative pole. The metal braiding layer 62 twisted into one strand is disposed at the second notch 52 and is electrically connected with the second notch 52 through a solder.

Figure 8:
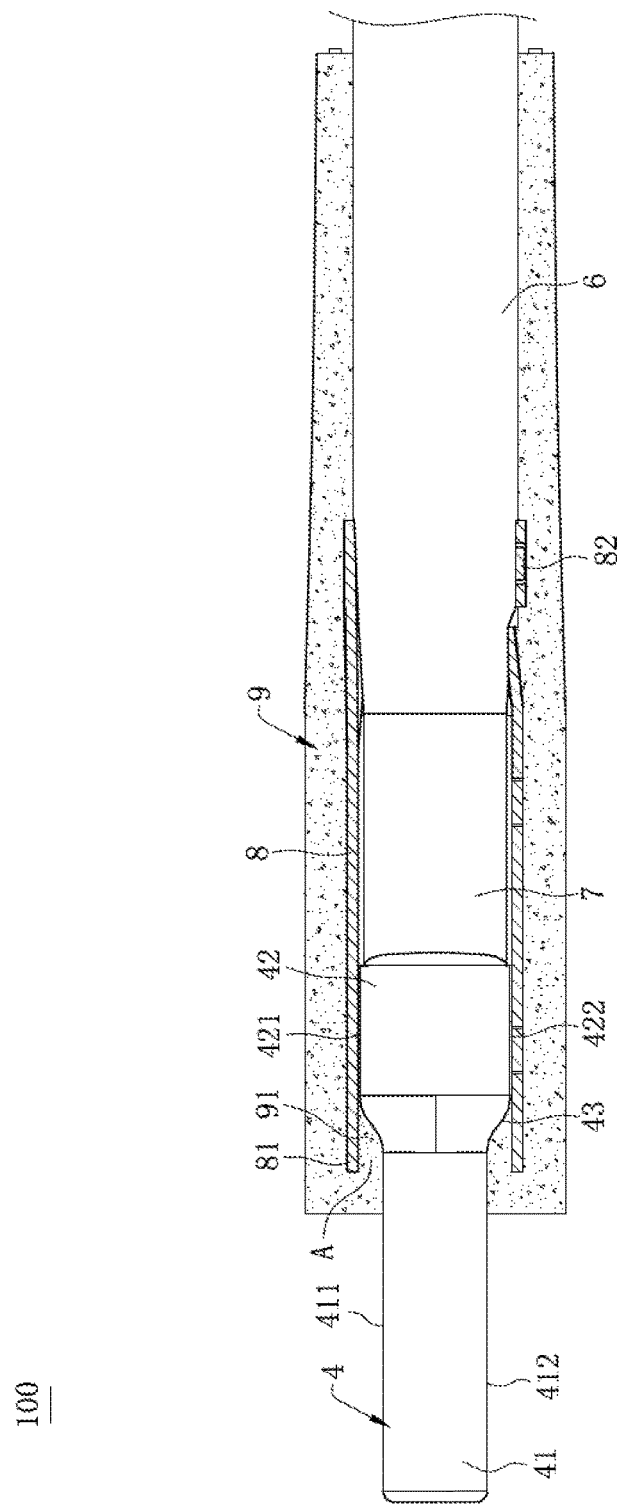
FIG. 8 is a schematic sectional view of only the rear shielding shell and the external insulator in FIG. 5A.

Referring to FIG. 5B, FIG. 8 and FIG. 9, the inner insulator 7 is molded outside the soldering portions 22, the circuit board 5 and the cable 6 through injection molding. A front end of the inner insulator 7 is accommodated inside the rear shell 42, and a rear end of the inner insulator 7 wraps the cable 6. Each of the opposite surfaces of the inner insulator 7 at upper and lower sides thereof is provided with a positioning hole 71 recessed inward, and the positioning hole 71 is communicated to the circuit board 5. The positioning hole 71 is formed by a thimble bolstering the circuit board 5 in a mold during the injection molding process of the inner insulator 7, thus preventing the circuit board 5 from being impacted by molten plastic to be inclined during the injection molding of the inner insulator 7. The inner insulator 7 is flush with the rear shell 42 at upper and lower sides thereof respectively, and the inner insulator 7 protrudes outward respectively at the left and right sides thereof relative to the rear shell 42.

Referring to FIG. 6, FIG. 8 and FIG. 9, the rear shielding shell 8 is a straight cylindrical structure formed by stamping and bending a metal plate. The rear shielding shell 8 is located outside the inner insulator 7. The rear shielding shell 8 is sleeved over the rear shell 42, and the front shielding shell 4 and the rear shielding shell 8 are fixedly connected together by spot welding at the rear shell 42. The rear shielding shell 8 has a front end portion 81 protruding forward out of the rear shell 42. The front end portion 81 extends forward to the front shell 41, and an accommodating space A is formed between the front end portion 81 and the outer surface of the front shielding shell 4. The accommodating space A surrounds an outer surface of the front shell 41. The accommodating space A extends backward to the rear shell 42 at upper and lower sides of the front shell 41. The accommodating space A extends backward to a rear end of the rear shielding shell 8 at left and right sides of the rear shielding shell 8, and a length of the front end portion 81 protruding forward beyond the rear shell 42 is 0.8 mm or more in a front-rear direction. In other words, a length of the accommodating space A in the front-rear direction is 0.8 mm or more. The rear end of the rear shielding shell 8 is provided with a wire clamping portion 82 for clamping the cable 6.

Referring to FIG. 8 and FIG. 9, the external insulator 9 is molded outside the front shielding shell 4, the rear shielding shell 8 and the cable 6 through injection molding, and during the molding of the external insulator 9, molten plastic may gradually wrap a rear end of the front shell 41 from back to front and be filled into the accommodating space A from front to back again. In this way, the external insulator 9 wrapped outside the rear shielding shell 8 at a substantially same thickness, such that the shrinkage of the external insulator 9 outside the rear shielding shell 8 is substantially the same, and the accommodating space A limits the tension generated when the external insulator 9 is molded. The molten plastic will form a fastening portion 91 within the accommodating space A after being cooled, so as to enable the external insulator 9 to be efficiently retained on the front shielding shell 4 and the rear shielding shell 8, thereby preventing degumming and cracking phenomenons between the front shielding shell 4 and the external insulator 9.

Referring to FIG. 1, FIG. 8 and FIG. 9, in other embodiments, the front shielding shell 4 may be a straight cylindrical structure, and the front end of the rear shielding shell 8 has the front end portion 81 enlarged outward relative to the rear end thereof. The front end portion 81 extends forward to the front shielding shell 4, and the accommodating space A is formed between the front end portion 81 and the outer surface of the front shielding shell 4. That is, the rear shielding shell 8 is shaped with a large front opening and a small rear opening. In this way, a close fit between the front shielding shell 4 and the external insulator 9 can also be implemented. Other structures are the same as those in the foregoing embodiment.

To sum up, the connector assembly according to certain embodiments of the present invention has the following beneficial effects:

1. By forming the accommodating space A between the rear shielding shell 8 and the outer surface of the front shielding shell 4, when the external insulator 9 is injection-molded, the external insulator 9 is molded outside the front shielding shell 4 and the rear shielding shell 8 and fills into the accommodating space A. The accommodating space A limits the tension generated when the external insulator 9 is molded, and the molten plastic will form the fastening portion 91 within the accommodating space A after being cooled, so as to enable the external insulator 9 to be efficiently retained on the front shielding shell 4 and the rear shielding shell 8, thereby preventing degumming and cracking phenomenons between the front shielding shell 4 and the external insulator 9.

2. A length of the front end portion 81 protruding forward beyond the rear shell 42 is 0.8 mm or more in the front-rear direction. In other words, a length of the accommodating space A in the front-rear direction is 0.8 mm or more. In this way, a length of the external insulator 9 fastened in the accommodating space A can be relatively large, and the external insulator 9 can be efficiently retained on the front shielding shell 4 and the rear shielding shell 8.

3. The accommodating space A surrounds an outer surface of the front shell 41 to enable a part of the periphery of the external insulator 9 to be fastened in the accommodating space A, such that the external insulator 9 is closely fit with the periphery of the front shielding shell 4.

4. The two power wires 61 are stacked up and down to be disposed at the first notch 51 and are electrically connected with the first notch 51 through a solder (not shown). In this way, compared with a thicker power wire 61 used as a positive pole in the related art, the overall flexibility of the cable 6 is better, and the two power wires 61 can be distributed in gap positions in the cable 6, such that the distribution of the cable 6 is more even and overall diameter is relatively small.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:
1. A connector assembly, comprising:
an insulating body;

a plurality of terminals, disposed in the insulating body;
a front shielding shell, shielded outside the insulating body, wherein the front shielding shell has a front shell and a rear shell enlarged relative to the front shell;
a rear shielding shell, covering the rear shell and having a front end portion protruding out of the rear shell and extending forward to the front shell, wherein an accommodating space is formed between the front end portion and an outer surface of the front shielding shell; and
an external insulator, molded outside the front shielding shell and the rear shielding shell and filled into the accommodating space.

2. The connector assembly according to claim 1, wherein the accommodating space surrounds an outer surface of the front shell.

3. The connector assembly according to claim 1, wherein a length of the front end portion protruding forward beyond the rear shell is 0.8 mm or more.

4. The connector assembly according to claim 1, wherein the accommodating space extends backward to the rear shell at upper and lower sides of the rear shielding shell, and the accommodating space extends backward to a rear end of the rear shell at left and right sides of the rear shielding shell.

5. The connector assembly according to claim 4, further comprising an inner insulator, wherein the rear shell protrudes outward respectively at upper and lower sides thereof and is flushed respectively at left and right sides thereof relative to the front shell, and the inner insulator protrudes outward respectively at left and right sides thereof relative to the rear shell.

6. The connector assembly according to claim 1, further comprising a cable electrically connected with the terminals, wherein the rear shielding shell is a straight cylindrical structure, and a rear end of the rear shielding shell is provided with a wire clamping portion for clamping the cable.

7. The connector assembly according to claim 1, wherein the front shell and the rear shell are integrated formed, and the front shielding shell and the rear shielding shell are connected through spot welding.

8. The connector assembly according to claim 1, further comprising a circuit board and an inner insulator covering the circuit board, wherein the terminals are connected with the circuit board, each of two opposite surfaces of the inner insulator at upper and lower sides thereof is provided with a positioning pinhole recessed inward, and the positioning pinhole is communicated to the circuit board.

9. The connector assembly according to claim 1, further comprising a circuit board and a cable, wherein the terminals are connected with the circuit board, one end of the circuit board is formed with a first notch recessed inward, and the cable has two power wires stacked up and down to be disposed at the first notch and electrically connected with the first notch.

10. The connector assembly according to claim 9, wherein one end of the circuit board is provided with a second notch recessed inward, and the cable has a metal braiding layer disposed at the second notch and electrically connected with the second notch.

11. The connector assembly according to claim 1, wherein the insulating body has a mating slot, the terminals are disposed on upper and lower sides of the mating slot respectively in an upper row and a lower row, and the terminals in the upper and lower rows are 180-degree symmetrical relative to a center of the mating slot.

12. A connector assembly, comprising:
an insulating body;
a plurality of terminals, disposed in the insulating body;
a front shielding shell, shielding the insulating body;
a rear shielding shell, covering a rear end of the front shielding shell, wherein an accommodating space is formed between the rear shielding shell and an outer surface of the front shielding shell; and
an external insulator, molded outside the front shielding shell and the rear shielding shell and filled in the accommodating space.

13. The connector assembly according to claim 12, wherein the accommodating space surrounds an outer surface of the front shell.

14. The connector assembly according to claim 12, wherein a length of the accommodating space in a front-rear direction is 0.8 mm or more.

15. The connector assembly according to claim 12, wherein the front shielding shell has a front shell and a rear shell enlarged relative to the front shell, the rear shielding shell has a front end portion protruding out of the rear shell and extending forward to the front shell, and the accommodating space is formed between the front end portion and the outer surface of the front shielding shell.

16. The connector assembly according to claim 15, further comprising an inner insulator, wherein the rear shell protrudes outward respectively at upper and lower sides thereof and is aligned respectively at left and right sides thereof relative to the front shell, and the inner insulator protrudes outward respectively at left and right sides thereof relative to the rear shell.

17. The connector assembly according to claim 12, wherein the rear shielding shell is a cylindrical structure, and a front end thereof has a front end portion enlarged outward, the front end portion extends forward to the front shielding shell, and the accommodating space is formed between the front end portion and the outer surface of the front shielding shell.

18. The connector assembly according to claim 12, further comprising a circuit board and a cable, wherein the terminals are connected with the circuit board, one end of the circuit board forms a first notch recessed inward, and the cable has two power wires stacked up and down to be disposed at the first notch and electrically connected with the first notch.

19. The connector assembly according to claim 18, wherein one end of the circuit board is provided with a second notch recessed inward, and the cable has a metal braiding layer disposed at the second notch and electrically connected with the second notch.

20. The connector assembly according to claim 12, wherein the insulating body has a mating slot, the terminals are disposed on upper and lower sides of the mating slot respectively in an upper row and a lower row, and the terminals in the upper and lower rows are 180-degree symmetrical relative to a center of the mating slot.

* * * * *